(12) United States Patent
Zimmermann (10) Patent No.: US 6,480,550 B1
(45) Date of Patent: Nov. 12, 2002

(54) METHOD OF COMPRESSING AN ANALOGUE SIGNAL

(75) Inventor: Gerhard Zimmermann, Vienna (AT)

(73) Assignee: Ericsson Austria AG, Vienne (AT)

(*) Notice: Subject to any disclaimer, the term of this patent is extended or adjusted under 35 U.S.C. 154(b) by 0 days.

(21) Appl. No.: 09/077,836

(22) PCT Filed: Dec. 3, 1996

(86) PCT No.: PCT/AT96/00241
§ 371 (c)(1),
(2), (4) Date: Nov. 3, 1998

(87) PCT Pub. No.: WO97/21274
PCT Pub. Date: Jun. 12, 1997

(30) Foreign Application Priority Data

Dec. 4, 1995 (AT) ............................................. 1976/95

(51) Int. Cl.[7] .................. H04B 14/04; H04B 14/06; G06F 15/00; G10L 21/00; H03M 3/00
(52) U.S. Cl. .................. 375/242; 704/200; 704/230; 704/503; 375/245; 341/143
(58) Field of Search ............................. 370/202, 280, 370/521; 704/500–504, 230–231, 251, 201, 200, 211–212; 341/63, 81, 143; 375/242, 244, 245, 249

(56) References Cited

U.S. PATENT DOCUMENTS

| | | | |
|---|---|---|---|
| 4,214,125 A | 7/1980 | Mozer et al. | 704/268 |
| 4,314,105 A | 2/1982 | Mozer | 375/246 |
| 4,384,169 A | 5/1983 | Mozer et al. | 704/206 |
| 4,384,170 A | 5/1983 | Mozer et al. | 704/268 |
| 4,458,110 A | 7/1984 | Mozer | 704/211 |
| 4,727,506 A | 2/1988 | Fling | 708/551 |
| 4,839,923 A * | 6/1989 | Kotzin | 370/521 |
| 4,870,685 A | 9/1989 | Kadokawa et al. | 704/212 |
| 5,226,084 A * | 7/1993 | Hardwick et al. | 704/230 |
| 5,668,923 A * | 9/1997 | Siwiak et al. | 704/503 |
| 5,920,840 A * | 7/1999 | Satyamurti et al. | 704/503 |

FOREIGN PATENT DOCUMENTS

| | | |
|---|---|---|
| JP | 59-182639 | 10/1984 |
| SU | 1107308 A | 8/1984 |

OTHER PUBLICATIONS

International Search Report re PCT/AT 96/00241 Date of Mailing: Apr. 10, 1997.

International Preliminary Examination Report re PCT/AT 96/00241 Date of Completion: Dec. 29, 1997.

* cited by examiner

*Primary Examiner*—Wellington Chin
*Assistant Examiner*—Maikhanh Tran
(74) *Attorney, Agent, or Firm*—Burns, Doane, Swecker & Mathis, L.L.P.

(57) ABSTRACT

Described is a method of compressing an analogue signal, e.g. a voice signal, the signal function being continuously sampled, quantized and encoded into data words, the difference between each two successive data words determined and each difference value quantized and encoded.

9 Claims, 8 Drawing Sheets

FIG. 9

METHOD OF COMPRESSING AN ANALOGUE SIGNAL

The invention relates to a method for compressing an analog signal, for example a voice signal, the signal function being continuously sampled, quantized and encoded into data words and the difference between each two successive data words being formed, then each difference value being quantized and encoded.

Known methods of this type, which are used for example for voice compression and voice coding in transmission systems, achieve an improvement in the transmission quality by increasing the compression rates, as a result of which, however, the requisite implementation outlay increases. The methods used in telecommunications are standardized as CCITT and ITU standards. In this case, the A-law and U-law coding for the PCM telephony standard at 64 kbit/s represents the reference transmission quality. The standards G722, G726 for ADPCM at 32 kbit/s and G728 for LD-CELP at 16 kbit/s achieve good transmission quality, while the quality of the G730 standard for GSM at 13 kbit/s can only be classified as not as good.

The improvements to the existing compression methods that have been disclosed in various documents relate to an increase in the compression factor whilst retaining the quality, a reduction in the transmission errors whilst retaining the compression factor, or the transmission of additional information in the voice data stream. The disadvantage of this prior art is that the improvement in the voice quality is achieved by an additional outlay on hardware and/or a more complex program, which requires a faster signal processor.

SU-Patent 1107308 describes a data transmission system with error prediction signal compression based on a DPCM (delta modulation) method, the voice signal being filtered and converted in order to calculate therefrom linear prediction coefficients and the prediction error energy. The linear prediction signals are entered into a distortion computer which also receives code words for the most probable combinations of linear prediction coefficients from a ROM. The code word index corresponding to the minimum distortion is encoded for the multiplexer. However, this method presupposes a correspondingly high computer power.

Furthermore, known compression methods are also used in voice storage systems. In order to reduce the storage capacity of a voice mail system, voice data are compressed using various encoding algorithms (ADPCM, GSM, LD-CELP etc.). These compression methods offer a low encoding delay in association with low storage data rates. However, a primary disadvantage here is the high processor power requirement for the algorithms, with the result that the number of simultaneously available voice channels is limited.

An object of the invention, therefore, is to reduce the computer power required for a method of the type mentioned in the introduction.

A further object is to specify a method which enables the number of transmission voice channels to be increased whilst retaining the transmission quality and the computer power.

According to the invention, this is achieved by the fact that, from the data word stream, a predeterminable number of encoded data words are continuously stored as group and each group is successively processed in accordance with steps a) to f):

a) the difference between each two successive data words is calculated in a computation operation that is repeated for each data word of the group, b) the maximum value of the difference values of a group is determined and assigned a low-order scaling factor, steps c) to f) are executed in a computation operation that is repeated for each data word of the group, in which case c) a corrected difference value between successive data words of the group is formed by subtracting a respective data word from the data word determined in the preceding computation step, the result is respectively scaled using a scaling function dependent on the scaling factor, is quantized and encoded to form a low-order delta value, which delta value is then processed further, if appropriate stored, with the other delta values calculated in this way and the scaling factor of the group, d) the respective delta value is decoded again and descaled with reference to the associated scaling factor using the corresponding inverse scaling function, e) each descaled difference value is respectively added to the data word determined in the preceding computation step and f) the data word calculated in this way is used as data word of the preceding computation step in the succeeding computation step c) and e).

Using this method according to the invention makes it possible to dispense with complex calculations such as in the case of ADPCM, for example, and to replace them by simple computation operations such as addition and subtraction. The otherwise customary prediction algorithms are replaced by the analysis of current data, thereby affording high accuracy. The time delay that has to be accepted in the process is of no importance in voice storage applications, for instance. Furthermore, it is also possible to use signal-adapted quantization levels by, for instance, performing smaller quantization gradation for the low-frequency signal components, which are more prevalent in voice signals.

Essentially, it is possible to reduce the necessary computation power for compression, with the result that this method according to the invention is particularly suitable for digital voice memories.

In the method according to the invention, the signal is immediately decoded again after encoding in order also to compensate for possible deviations with the next quantization operation.

A further object of the invention is to specify a method of the type mentioned in the introduction for slowly changing analog signals which enables the information to be compressed with the same computer power, without a noticeable time delay occurring.

According to the invention, this is achieved by the fact that the characterizing features of patent claim 1 are executed with the difference that step b1) is carried out instead of step b), comprising:

b1) the maximum value of the difference values of the preceding group is used for the assignment of a low-order scaling factor for the current group.

As a result, the scaling factor calculated for a preceding group is in each case used immediately as scaling factor for the current group so that it is not necessary firstly to wait for the calculation of the scaling factor in order to carry out scaling of the difference values. In this way, it is possible to prevent a time delay; a prerequisite for such an application of the respectively preceding scaling factor is a signal that does not change abruptly. This condition is usually fulfilled for a normal call tone.

In accordance with another variant of the invention, it may be provided that the scaling function is formed by division and the descaling function by multiplication by the scaling factor, the division being carried out by n and the multiplication by n by means of n-fold bit-by-bit shifting to the right and left respectively.

These shift operations are particularly simple to process and therefore demand only very little computation power.

A further feature of the invention may consist in the scaling function being formed by power formation to base 2.

This makes it possible to achieve a high computation speed since these computation operations can be carried out by simple bit shifting.

This correspondingly diminishes the influence of very large scaling factors.

In accordance with another variant of the invention, it may be provided that, for compression, for each scaled difference value a quantization level assigned to this value is read from a quantization table and, for decompression, a decoded value is assigned to each encoded value by means of a decoding table.

Complex computation operations can be obviated by using tables.

Furthermore, a feature of the invention may consist in the levels of the quantization table and of the decoding table being chosen essentially to correspond to the levels of a histogram of a loud speech item.

This has a particularly advantageous effect on the voice quality since prescaling means that all the signal elements tend to become loud signals.

In accordance with another variant of the invention, it may be provided that in step b) the maximum value of the difference values is assigned a scaling factor from a scaling table.

Complicated computation operations can be obviated by using a scaling table. The scaling table can be adapted to the respective requirements.

In a further design of the invention, it may be provided that the scaling factor is assigned such that the largest available quantization step reaches 80% of the largest difference value.

This is advantageous in the case of coarse gradation with large delta values since otherwise overshooting as a result of missing intermediate values can easily occur. This would lead to acoustically unpleasant odd harmonics.

A signal that has been compressed according to the invention is decompressed by application of steps d), e) and f).

The invention is described in detail below using exemplary embodiments which are illustrated in the drawings, in which.

Figure 1:
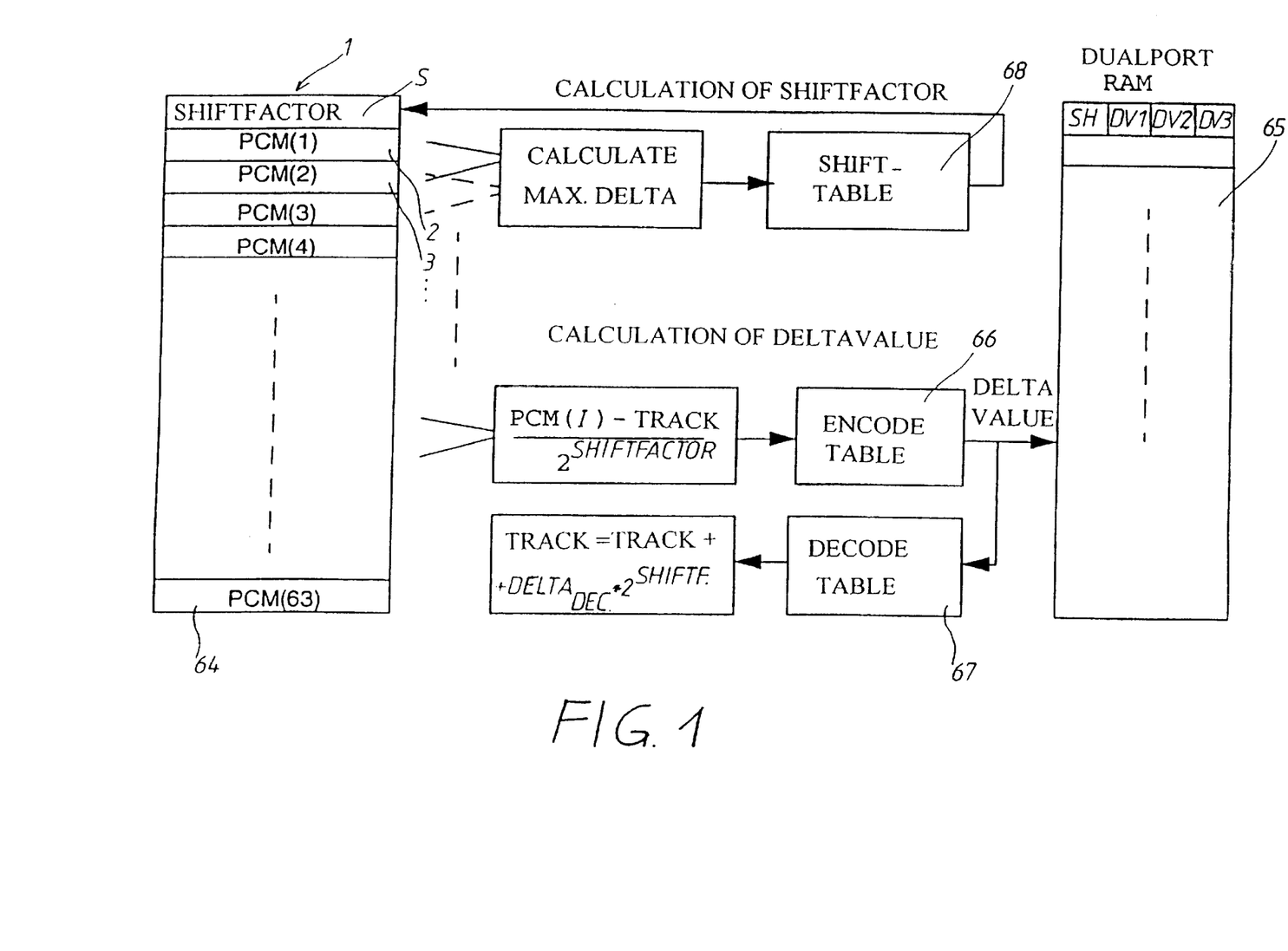
FIG. 1 shows a diagrammatic illustration of a method according to the invention.

The method sequence illustrated diagrammatically in FIG. 1 relates to a delta modulation method for compressing an analog signal, for example a voice signal, the signal function being continuously sampled, quantized and encoded into data words, and the difference between each two successive data words being formed, then each difference value being quantized and encoded, for example PCM-encoded.

In order to decompress the data compressed in this way, the difference value is added to the preceding calculated data word and the resultant value is decoded and combines to form an analog signal. This corresponds to the customary procedure in delta modulation.

For the purpose of explaining the invention, the analog signal is a voice signal, but any other analog signal can equally well be compressed in accordance with the invention.

Thus, PABX systems according to the prior art have the task of recording, and reproducing on retrieval, voice transmissions for message storage, communications and voice transmissions, e.g. for mail box systems, etc. These transmissions are usually stored in digital systems which have, as storage medium, a RAM, a hard disk or a flash ROM, which enable simultaneous operation of a plurality of voice channels.

In order, for example, to increase the storage capacity of a voice mail system, voice data are usually compressed using various coding algorithms (ADPCM, GSM, LD-CELP etc.). These compression methods offer a low encoding delay in association with low data rates to the store. However, a primary disadvantage consists in the high demands on the processor power for calculating the algorithms on which these compression methods are based.

In order to increase the number of simultaneously available voice channels, it is necessary to reduce the processor power required per channel.

This is realized by the method according to the invention as illustrated in FIG. 1, the quality of this method being comparable with that of a known ADPCM method. The performance, however, is increased in comparison with the ADPCM method in that a data analysis with the real-time voice data is carried out and less computer power is required in the process.

The method according to the invention comprises the following steps:

From the data word stream, a predeterminable number of encoded data words 2, 3, . . . , 64 are continuously stored as group 1 and each group 1 is successively processed in accordance with steps a) to f):

a) The difference between each two successive data words 2, 3, . . . , 64 is calculated in a computation operation that is repeated for each data word of the group.

b) The maximum value of the difference values of a group 1 is determined and assigned a low-order scaling factor S.

This is carried out in the function block "Calculate max. delta" whereupon the calculated value is assigned to the respective low-order scaling factor with the aid of a table 68. In this context, low-order means that a short, low-order data unit, e.g. 4 bits, is formed from relatively long higher-order data words.

Steps c) to f) are executed in a computation operation that is repeated for each data word of the group 1, the individual steps being defined as follows:

c) A corrected difference value between successive data words of the group 1 is formed by subtracting a respective data word from the data word (track) determined in the preceding computation step, and the result is in each case scaled with a scaling function dependent on the scaling factor S. In the case illustrated in FIG. 1, this is done by the power function with base 2, resulting in correspondingly small difference values for large values of the scaling factor S. The difference values which are scaled in such a way are then quantized in that the quantization level for the scaled difference is read from the quantization table 66 and encoded to form a delta value, which delta value is then stored with the other delta values calculated in this way and the scaling factor S of the group in a dual-port RAM 65, from where they can be retrieved for further processing, for example for transfer to a mass storage device, for example a hard disk. The following step d) is executed in order to take account of the encoding/decoding errors:

d) The respective delta value is decoded again in that the corresponding value is read out with reference to the decoding table 67. Descaling is then effected with reference to the associated scaling factor S using the corresponding inverse scaling function, in this case by multiplication by $2^S$.

e) Each descaled difference value is respectively added to the data word (track) determined in the preceding computation step.

f) The data word calculated in this way is used as data word of the preceding computation step (track) in the succeeding computation step c) and e).

According to the invention, the scaling factor which is calculated for the preceding group can also be used for the group following the latter and, as a result, a time delay due to the calculation operation can be avoided. This is realized according to the invention in that the steps described above are carried out with the difference that step b1) is carried out instead of step b), comprising:

b1) the maximum value of the difference values of the preceding group 1 is used for the assignment of a low-order scaling factor S for the current group 1.

The scaling function which is used in the exemplary embodiment according to FIG. 1 and raises the scaling factor to a power of 2 can be configured differently, as required; scaling directly via S is simplest, in that the difference values are divided by S and are multiplied by S during decoding. The computation operations required in the process are bit-by-bit shifting to the right and left respectively.

The method for decompressing a signal which is compressed according to the invention is achieved by application of steps d), e) and f).

The compression method according to the invention can be configured for example to 32 kbit/s, 24 kbit/s and 16 kbit/s. This can be shown using the exemplary embodiments described below. The fact that the power demand is 17 MIPS (mega instructions/second) for a G.726 ADPCM method and 37 MIPS for a G.728 LD-CELP can be used as comparison value. With commercial digital signal processors (DSP), therefore, it is possible to achieve only one to three channels per signal processor. The method according to the invention is improved with regard to the implementation outlay, whilst retaining a given transmission quality, and achieves a relatively large number of channels of a voice storage system with little outlay on hardware. When the compression method according to the invention is used for a voice storage system, this is similar to the sound and the technical measurement data according to the ADPCM standard G.726. Encoder and decoder typically require 2 MIPS DSP performance. The method according to the invention is about eight times faster than ADPCM and requires only 300 bytes/channel, which is distinctly less than in the case of other methods such as LD-CELP, GSM, which require 2 kbytes/channel. However, the method according to the invention results in a relatively high signal delay but this has no relevance in voice storage systems. As described above, this time delay can also be avoided by using the respectively previously calculated scaling factor. However, this method is suitable only for signal changes that are not abrupt.

Figure 2:
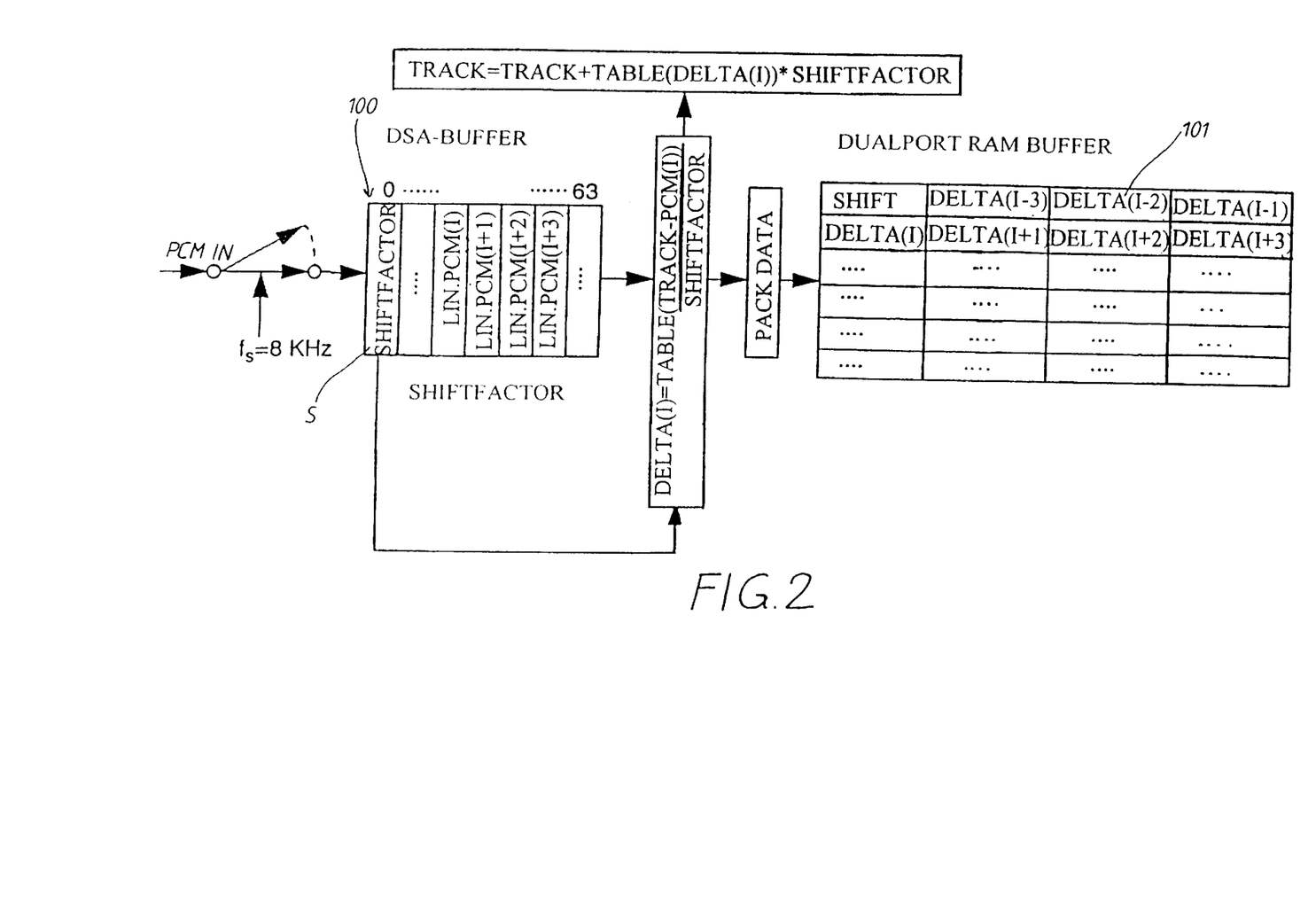
FIGS. 2 to 5 show diagrammatic illustrations of embodiments of the method according to the invention.

FIG. 2 illustrates the program organization of a 32 kbit/s play program for a method sequence for recording (RECORD) data words which are compressed according to the invention. The voice data are compressed before being stored in a dual-port RAM buffer 101. In this case, in a manner corresponding to the customary PCM sampling rate, every 125 µs a PCM voice data word is read in from the PCM highway and then linearized. Before the new PCM word is stored in a DSA buffer 100, which can hold a group of data words, the preceding PCM word is read out at the same location in the DSA buffer and stored in a register. In method step c) according to the invention, this preceding PCM sampling is subtracted from the data word which results from the preceding computation steps c) to f) and is designated as track, and then the difference is scaled by division by the scaling factor S. This is achieved by n-fold bit-by-bit shifting to the right, which does not require much computation. In this example, n can assume values of 0 to 5 depending on the scaling factor S. The scaling factor S is in this case determined in accordance with steps a) and b). For the resultant difference value, a delta value having a length of 4 bits is read from the quantization table. These 4 bits are combined in such a way that four PCM data words are contained in a 16-bit data word. This word is then stored in the dual-port RAM buffer 101. If the preceding data word was in actual fact the scaling factor S, this is packed together with the next three PCM data words into one word.

The beginning of an arriving message is indicated e.g. by a scaling factor 07 h as a result of which the instantaneous value is set to zero.

The track value for the next computation step is calculated in accordance with steps d) e) and f), the delta value being decoded with reference to the decoding table and being descaled using the scaling factor S, in this case being multiplied in that bit-by-bit shifting to the left is carried out, and each descaled difference value is respectively added to the data word (track) determined in the preceding computation step.

Figure 3:
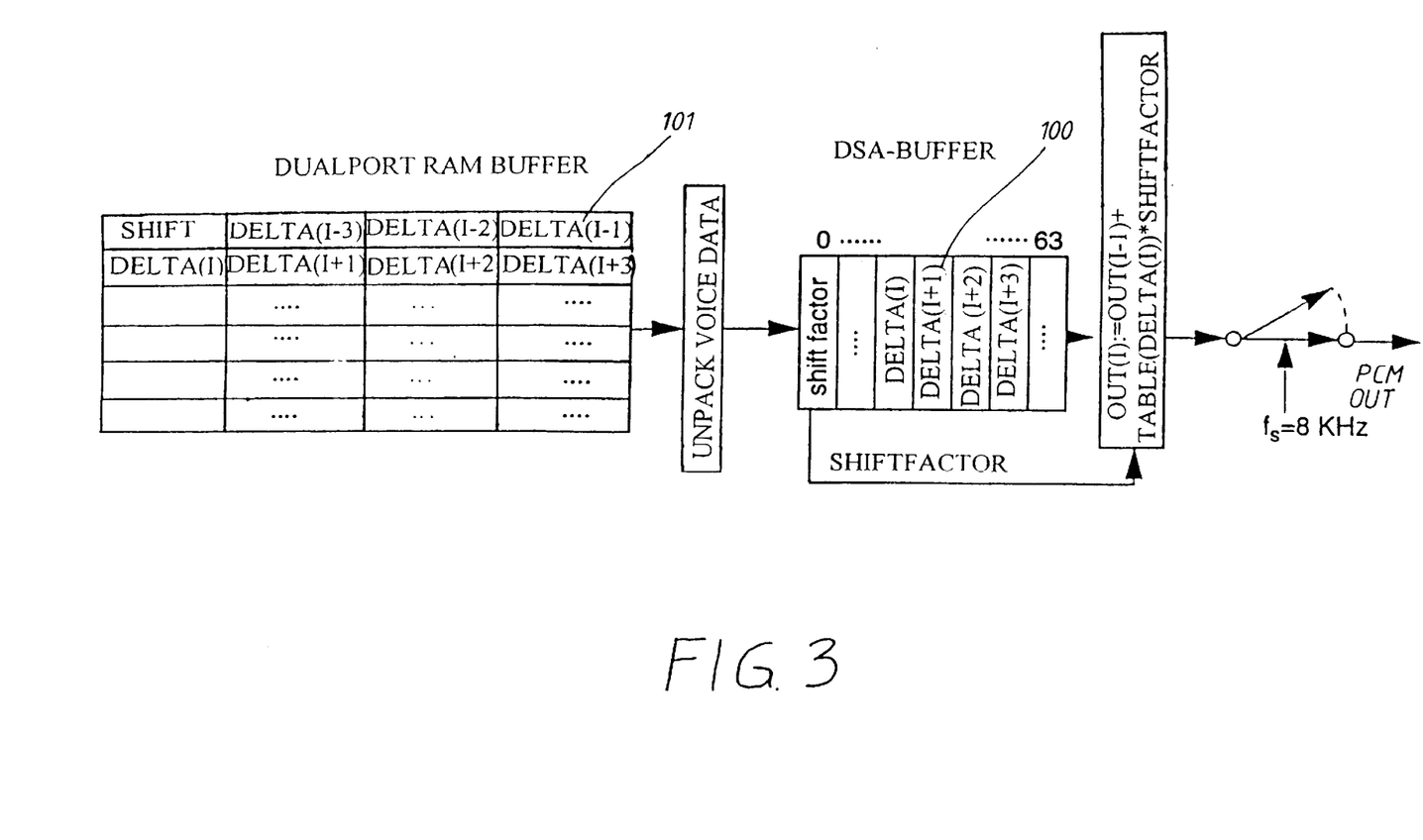

FIG. 3 illustrates the method steps for playing (PLAY) or decompressing the stored data. In this case, a 32 kbit/s play program is used to take apart the combined delta values from the dual-port RAM 101 before they are buffer-stored in the DSA buffer 100. A respective combined data word is read from the dual-port RAM 101, is then broken up into four subbytes and stored in the DSA buffer 100, one subbyte reaching one location in each case. The first word in this buffer contains the scaling factor. All the delta values are used as indexing for interrogation of the decoding table in order to obtain the decoded delta value which is then shifted n times to the left (n=0 to 5, depending on the scaling factor S) before they reach the PCM highway. A PCM word is sent onto the highway every 125 µs.

Figure 4:
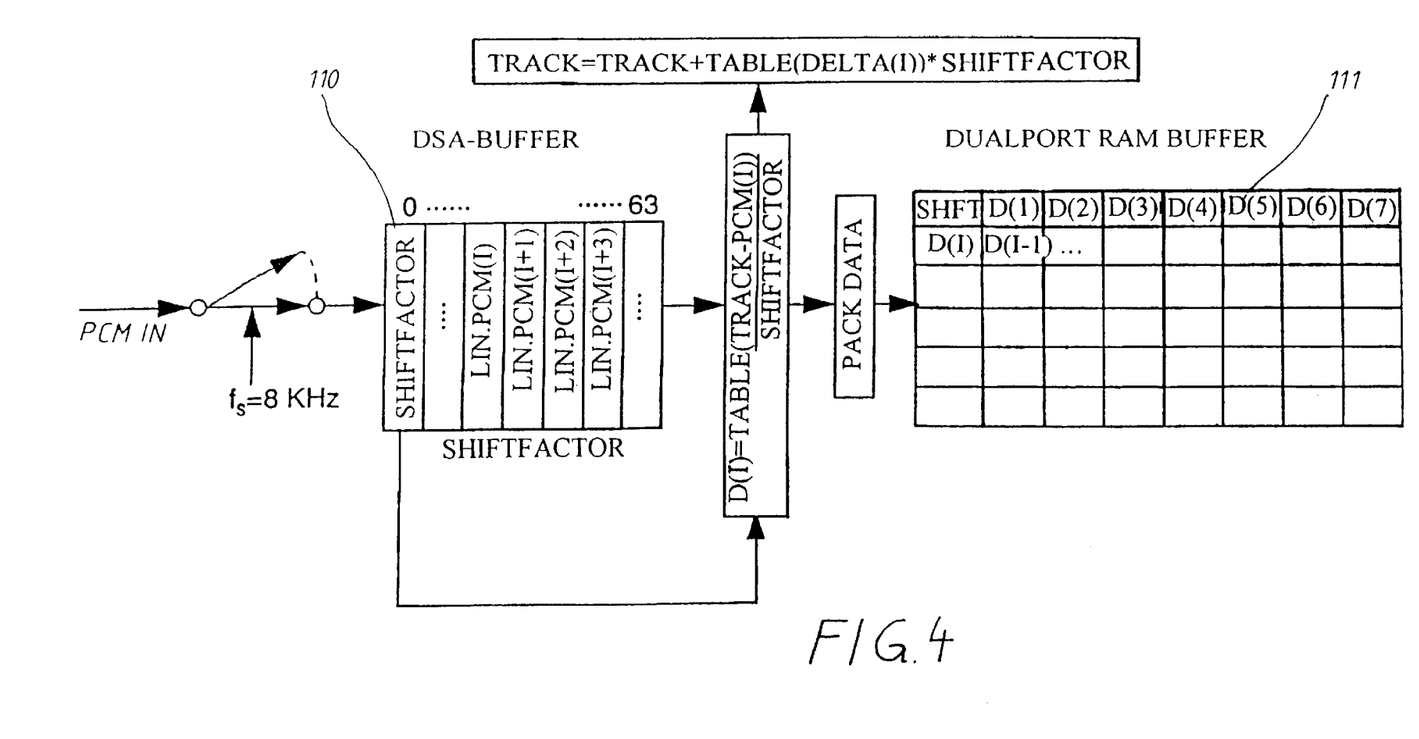

FIG. 4 shows the program sequence of a 16 kbit/s program which is used to filter and combine the voice data before they are stored in the dual-port RAM 111. In this case, one-byte A-law voice data are read from the PCM. highway every 125 µs. Before the new linearized PCM voice data are stored in the DSA buffer 110, the preceding PCM voice sampling is read out at the same location in the DSA buffer 110. This preceding PCM sampling is subtracted from the data word from the preceding computation step (track) and the difference is shifted n times to the right (n=0 to 3, depending on the scaling factor). For the resulting value, a two-bit delta index is read from a table. These two bits are combined, with the result that eight PCM voice data words are united in one 16-bit word. This word is then stored in the dual-port RAM buffer 111. If the preceding PCM data word was the scaling factor, this is combined with the next seven PCM voice data into one word.

Figure 5:
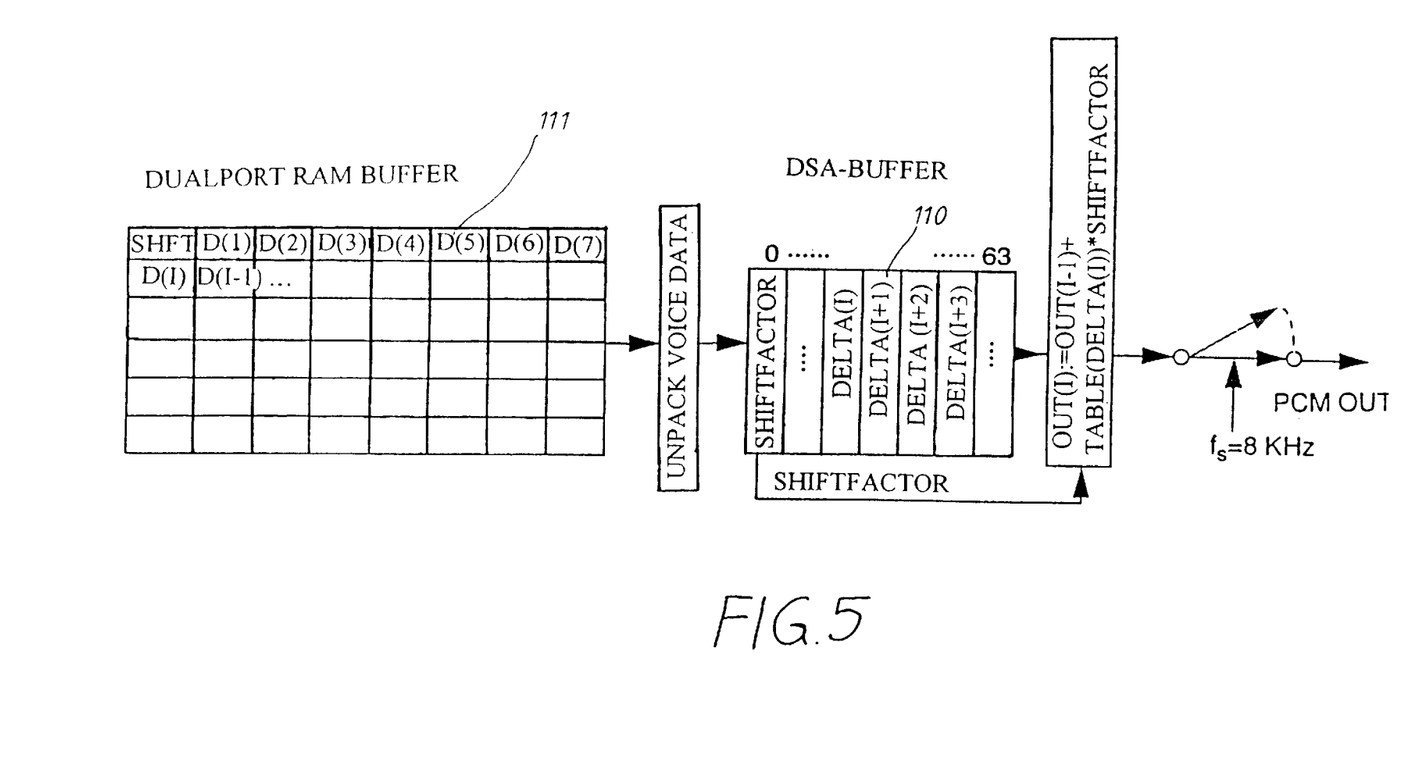

FIG. 5 illustrates the sequence of a 16 kbit/s play program, the combined voice data from the dual-port RAM being broken up before they are stored in the DSA buffer.

Voice data combined in individual data words are read from the dual-port RAM 111. This word is broken up by being divided into eight 2-bit subbytes and stored in the DSA buffer. One location corresponds to one subbyte. The first byte in this buffer is a shift bit. All the delta values are used as index for interrogation of a decoding table in order to obtain the genuine delta value which is then shifted n times to the left before they reach the PCM highway. In this case, n ranges from 0 to 3 and depends on the scaling factor S. A PCM voice byte passes onto the PCM highway and beyond every 125 µs.

The method according to the invention permits the use of signal-adapted quantization levels. Since customary voice signals tend to contain low-frequency signal components, smaller delta steps are more prevalent. Consequently, the hit probability can be increased in that the quantization tables contain more small levels than large levels.

Figure 6:
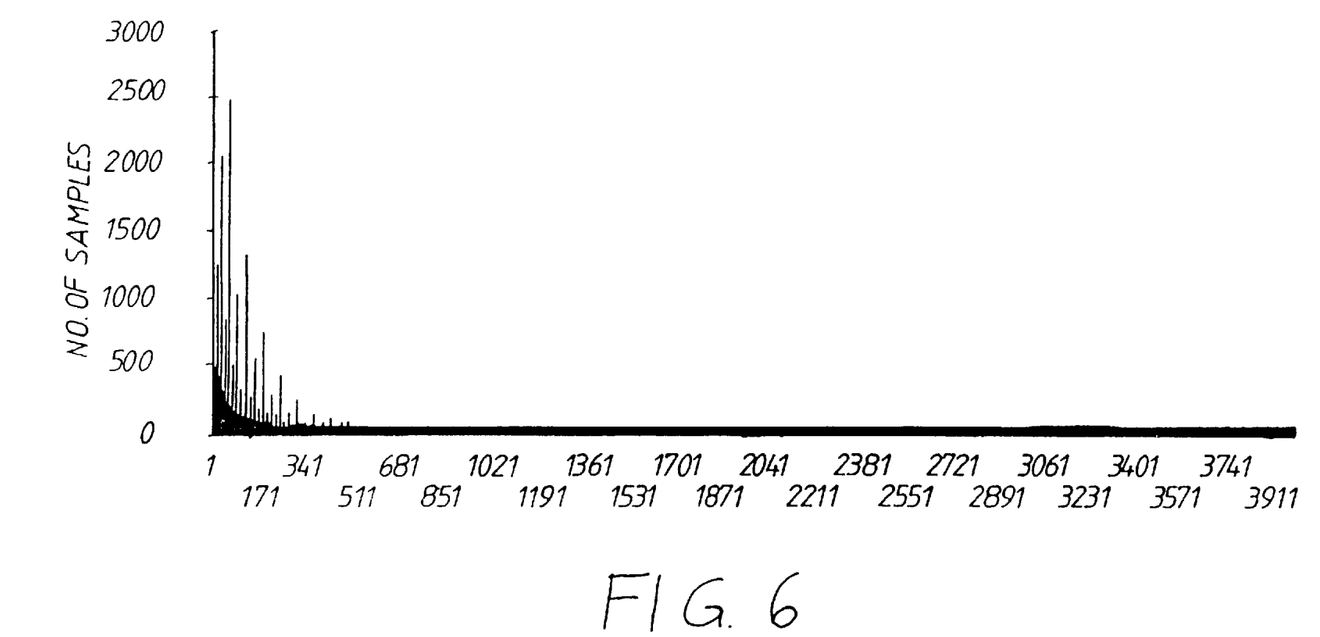
FIG. 6 shows a histogram of the difference values of a voice signal.
Figure 7:
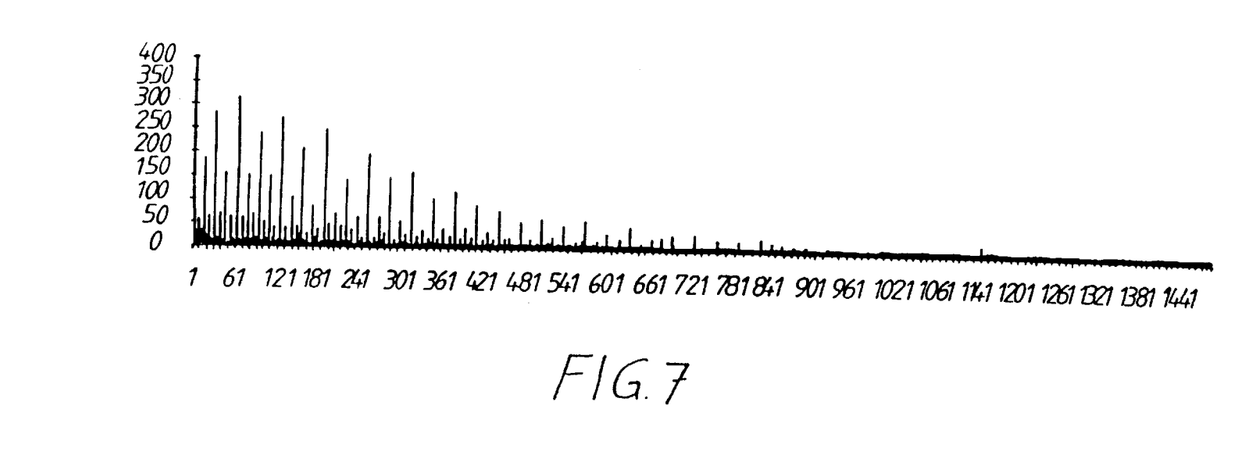
FIG. 7 shows a histogram of the difference values of a loud speech item.

FIG. 6 and FIG. 7 show examples in this respect of histograms of the difference values of a voice signal, spoken at normal volume, with three words in A-law or a loud speech item with the vowel A in A-law, with maximum driving. The Y axis represents the number of samples and the X axis the level values (+−4096) digitized for A-law.

Figure 8:
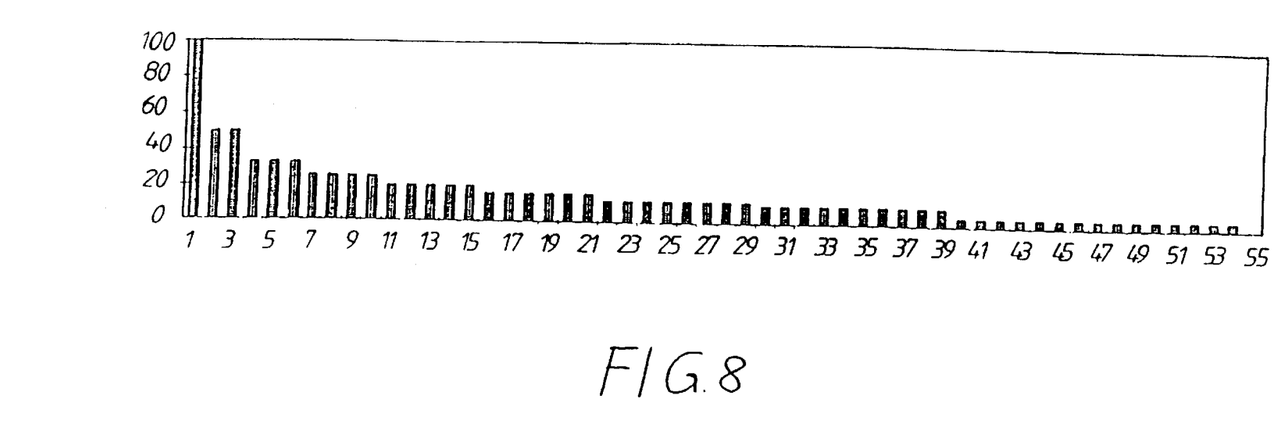
FIG. 8 shows a histogram of a signal which is optimized for the method according to the invention.

FIG. 8 reproduces a histogram of a voice signal which has already been prescaled by the method according to the invention and essentially corresponds to the loud speech item in accordance with FIG. 7, but has been changed in the direction of the speech item in accordance with FIG. 6 and utilizes each level of the quantization table with in each case eight positive and negative levels the same number of times, in this case one hundred times. The X axis runs according to the prescaling from 0 to 64. The quantization levels of the quantization table are chosen according to this histogram from FIG. 8, with the result that the levels of the quantization table and of the decoding table are chosen essentially to correspond to the levels of a histogram of a loud speech item. This is justified in that voice quality can be classified only in distinctly perceptible passages of the reproduction by the receiver. Since, therefore, on the one hand the harmonic distortion factor does not have a particular effect in speech intervals and, on the other hand, all the signal elements tend to become loud signals due to the prescaling on account of the adaptive scaling factor, the step function is put into the vicinity of a loud signal. A low harmonic distortion factor is achieved thereby.

The interaction of scaling, quantization and decoding tables is designed such that the harmonic distortion factor occurring as a result of the compression does not sound disturbing, but rather imparts only a warm sound to the reproduction, with the result that only even harmonics occur, primarily the second harmonic. The scaling factor table determines the scaling factor in such a way that the largest available quantization step reaches 70%–90%, preferably 80% of the largest difference value. This is favorable since, as a result of coarse gradation with large deltas, overshooting as a result of missing intermediate values can easily occur. This would lead to acoustically unpleasant odd harmonics. The quantization table is designed such that the delta value chosen is smaller than that which is necessary. Consequently, what is produced overall from the interaction of scaling factor table and quantization and decoding tables is a low-pass filter character of the compressed and decompressed signals with triangular distortion components and thus the formation of even harmonics which impart an acoustically warm sound to the reproduction.

Figure 9:
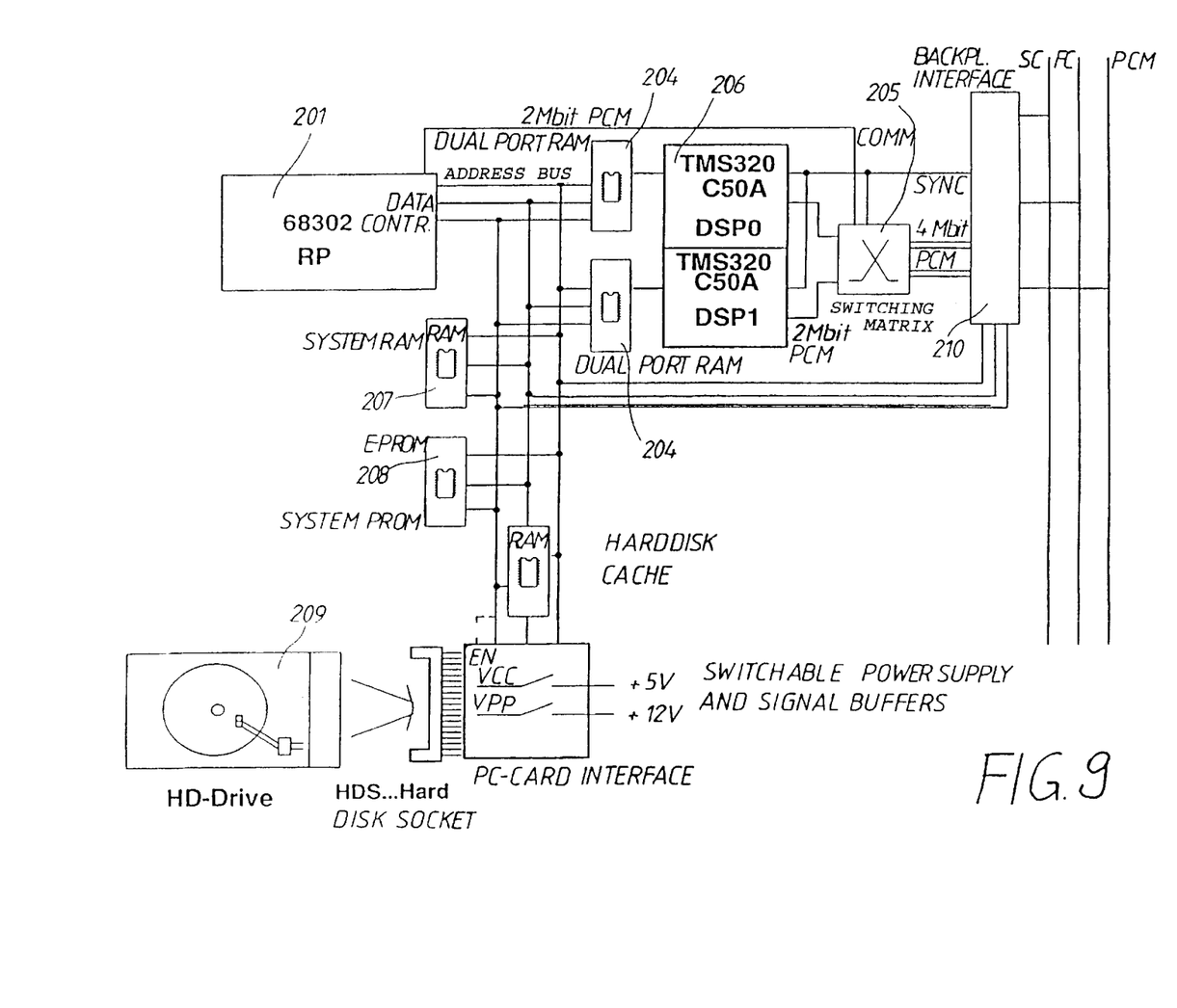
FIG. 9 shows an embodiment of a circuit arrangement for carrying out the method according to the invention.

FIG. 9 illustrates a circuit arrangement which can be used to realize the method according to the invention. A regional processor 201, for example of the 68302 type, controls all the other function blocks and communicates via its address and data bus with a back plane interface 210, via which the PCM data word stream is fed to a digital switching matrix 205. The digital switching matrix 205 converts the 4-Mbit system buses to 2-Mbit local PCM buses for the two digital signal processors 206, for example TMS320C50A, which are rated for 20 MIPS. The data calculated by the method according to the invention are stored in the dual-port RAM 204 having in each case a storage capacity of 1 kword so that they can be retrieved for further processing. The quantization and decoding tables are available in the system PROM 208, for example an EPROM.

What is claimed is:

1. A method for compressing an analog signal, the signal function being continuously sampled, quantized and encoded into data words and the difference between each two successive data words being formed, then each difference value being quantized and encoded, in which from the data word stream, a predeterminable number of encoded data words are continuously stored as group (1) and each group (1) is successively processed in accordance with steps a) to c):

a) the difference between each two successive data words is calculated in a computation operation that is repeated for each data word of the group,
   b) the maximum value of the difference values of a group (1) is determined and assigned a low-order scaling factor, step c) is executed in a computation operation that is repeated for each data word of the group (1), in which case c) a corrected difference value between successive data words of the group (1) is formed by subtraction in each case of the preceding data word, the result is respectively scaled using a scaling function dependent on the scaling factor, is quantized and encoded to form a low-order delta value, which delta value is then processed further, with the other delta values calculated in this way and the scaling factor of the group, wherein within the computation operation that is repeated for each data word of the group, after step c) each data word is processed in accordance with steps d) to f):

d) the respective delta value is decoded again and descaled with reference to the associated scaling factor using the corresponding inverse scaling function,
   e) each descaled difference value is respectively added to the old data word determined in the preceding computation step and
   f) the new old data word calculated in this way is used as old data word of the preceding computation step in the succeeding computation steps c) and e).

2. A method for compressing an analog signal, the signal function being continuously sampled, quantized and encoded into data words and the difference between each two successive data words being formed, then each difference value being quantized and encoded, in which from the data word stream, a predeterminable number of encoded data words are continuously stored as group (1) and each group (1) is successively processed in accordance with steps a) to c):

a) the difference between each two successive data words is calculated in computation operation that is repeated for each data word of the group, b) the maximum value of the difference values of a group (1) is determined and assigned a low-order scaling factor, step c) is executed in a computation operation that is repeated for each data word of the group (1), in which case c) a corrected difference value between successive data words of the group (1) is formed by subtraction in each case of the preceding data words, the result is respectively scaled using a scaling function dependent on the scaling factor, is quantized and encoded to form a low-order delta value, which delta value is then processed further, with the other delta values calculated in this way and the scaling factor of the group, wherein in step b) the maximum value of the difference values of the preceding group (1) is used for assignment of a low-order scaling factor for the current group (1), and within the computation operation that is repeated for each data word of the group, after step c) each data word is processed in accordance with steps d) to f):

d) the respective delta value is decoded again and descaled with reference to the associated scaling factor using the corresponding inverse scaling function, e) each descaled difference value is respectively added to the old data word determined in the preceding computation step and f) the new old data word calculated in this way is used as old data word of the preceding computation steps c) and e).

3. The method as claimed in claim 1, wherein the scaling function is formed by division and the descaling function of multiplication by the scaling factor, the division being carried out by n and the multiplication by n by means of n-fold bit-by-bit shifting to the right and left respectively.

4. The method as claimed in claim 1, wherein the scaling function is formed by power formation to base 2.

5. The method as claimed in claim 1, wherein, for compression, for each scaled difference value a quantization level assigned to this value is read from a quantization table and, for decompression, a decoded value is assigned to each encoded value by means of a decoding table.

6. The method as claimed in claim 5, wherein the levels of the quantization table and of the decoding table are chosen essentially to correspond to the levels of a histogram of a loud speech item.

7. The method as claimed in claim 1, wherein in step b) the maximum value of the difference values is assigned a scaling factor from a scaling table.

8. The method as claimed in claim 7, wherein the scaling factor is assigned such that the largest available quantization step reaches 80% of the largest difference value.

9. The method as claimed in claim 1, wherein for decompression of the compressed signal, in a computation operation that is repeated for each data word of the group, steps d) and e) and also a step f1) are carried out, the latter comprising f1) the new old data word calculated in this way is used as old data word of the preceding computation step in computation step e) of the succeeding computation operation.

* * * * *